(12) United States Patent
Chao et al.

(10) Patent No.: US 10,756,177 B2
(45) Date of Patent: Aug. 25, 2020

(54) SELF-LIMITING AND CONFINING EPITAXIAL NUCLEATION

(71) Applicant: INTERNATIONAL BUSINESS MACHINES CORPORATION, Armonk, NY (US)

(72) Inventors: Robin Hsin Kuo Chao, Cohoes, NY (US); Kangguo Cheng, Schenectady, NY (US); Nicolas Loubet, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/388,028

(22) Filed: Apr. 18, 2019

(65) Prior Publication Data
US 2019/0252493 A1    Aug. 15, 2019

Related U.S. Application Data

(62) Division of application No. 15/848,953, filed on Dec. 20, 2017, now Pat. No. 10,340,341.

(51) Int. Cl.
*H01L 29/06*    (2006.01)
*H01L 29/66*    (2006.01)
(Continued)

(52) U.S. Cl.
CPC ...... *H01L 29/0673* (2013.01); *H01L 21/0217* (2013.01); *H01L 21/02636* (2013.01); *H01L 21/30604* (2013.01); *H01L 21/31116* (2013.01); *H01L 29/0649* (2013.01); *H01L 29/0665* (2013.01); *H01L 29/0847* (2013.01); *H01L 29/41733* (2013.01); *H01L 29/41791* (2013.01); *H01L 29/42392* (2013.01); *H01L 29/458* (2013.01); *H01L 29/6653* (2013.01); *H01L 29/66439* (2013.01); *H01L 29/66606* (2013.01); *H01L 29/66636* (2013.01); *H01L 29/66742* (2013.01); *H01L 29/66772* (2013.01); *H01L 29/66795* (2013.01); *H01L 29/66871* (2013.01); *H01L 29/785* (2013.01); *H01L 29/786* (2013.01); *H01L 29/78618* (2013.01); *H01L 29/78696* (2013.01); *H01L 29/665* (2013.01); *H01L 29/66545* (2013.01)

(58) Field of Classification Search
CPC ................... H01L 29/66636; H01L 29/66606
See application file for complete search history.

(56) References Cited

U.S. PATENT DOCUMENTS 8,723,262 B2    5/2014  Basker et al.
9,202,920 B1   12/2015  Liu et al.
(Continued)

OTHER PUBLICATIONS

List of IBM Patents or Patent Applications Treated as Related; (Appendix P), Filed Apr. 19, 2019; 2 pages.
(Continued)

*Primary Examiner* — Farun Lu
(74) *Attorney, Agent, or Firm* — Cantor Colburn LLP; Vazken Alexanian

(57) ABSTRACT

A method of fabricating a semiconductor device includes forming a fin in a substrate and depositing a spacer material on the fin. The method includes recessing the spacer material so that a surface of the fin is exposed. The method includes removing a portion of the fin within lateral sidewalls of the spacer material to form a recess, leaving a portion of the fin on the lateral sidewalls. The method further includes depositing a semiconductor material within the recess.

20 Claims, 10 Drawing Sheets

(51) Int. Cl.
    *H01L 21/02*     (2006.01)
    *H01L 21/311*     (2006.01)
    *H01L 29/08*     (2006.01)
    *H01L 29/417*     (2006.01)
    *H01L 29/78*     (2006.01)
    *H01L 29/786*     (2006.01)
    *H01L 29/423*     (2006.01)
    *H01L 21/306*     (2006.01)
    *H01L 29/45*     (2006.01)

(56) References Cited

U.S. PATENT DOCUMENTS

| | | |
|---|---|---|
| 9,431,305 B1 | 8/2016 | Anderson et al. |
| 9,530,863 B1 | 12/2016 | Zhang et al. |
| 2016/0284822 A1 | 9/2016 | Cai et al. |
| 2016/0365345 A1 | 12/2016 | Ching et al. |
| 2016/0372559 A1 | 12/2016 | Zang |
| 2016/0372580 A1 | 12/2016 | Ching et al. |
| 2017/0025431 A1* | 1/2017 | Kanakamedala ............ H01L 27/11578 |
| 2017/0288018 A1* | 10/2017 | Tung ............... H01L 29/66439 |
| 2017/0309624 A1* | 10/2017 | Cheng ............ H01L 21/30604 |
| 2019/0131415 A1* | 5/2019 | Cheng ............ H01L 29/1033 |

OTHER PUBLICATIONS

Kuo Chao, et al., "Self-Limiting and Confining Epitaxial Nucleation", U.S. Appl. No. 15/848,953, filed Dec. 20, 2017.
Kuo Chao, et al., "Self-Limiting and Confining Epitaxial Nucleation", U.S. Appl. No. 16/388,035, filed Apr. 18, 2019.

\* cited by examiner

ND CONFINING EPITAXIAL NUCLEATION

SELF-LIMITING AND CONFINING EPITAXIAL NUCLEATION

DOMESTIC PRIORITY

This application is a division of and claims priority from U.S. patent application Ser. No. 15/848,953, filed on Dec. 20, 2017, the entire contents of which are incorporated herein by reference.

BACKGROUND

The present invention generally relates to fabrication methods and resulting structures for semiconductor devices. More specifically, the present invention relates to self-limiting and confining epitaxial nucleation.

Semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

SUMMARY

Embodiments of the present invention are directed to a method for fabricating a semiconductor device. A non-limiting example of the method includes forming a fin in a substrate and depositing a spacer material on the fin. The method includes recessing the spacer material so that a surface of the fin is exposed. The method includes removing a portion of the fin within lateral sidewalls of the spacer material to form a recess, leaving a portion of the fin on the lateral sidewalls. The method further includes depositing a semiconductor material within the recess.

Another non-limiting example of the method includes forming a nanosheet stack on a substrate and depositing a spacer material on the nanosheet stack. The method includes recessing the spacer material so that a surface of the nanosheet stack is exposed. The method includes removing a portion of the nanosheet stack within lateral sidewalls of the spacer material to form a recess, leaving a portion of the nanosheet stack on the lateral sidewalls. The method further includes depositing a semiconductor material within the recess.

Embodiments of the invention are directed to a semiconductor device. A non-limiting example of the semiconductor device includes a fin patterned in a substrate and isolation regions arranged on the substrate and around the fin. The semiconductor device includes a spacer arranged over the fin, with a portion of the fin lining a lateral sidewall of the spacer. The semiconductor device includes a tapered recess arranged within the fin and a semiconductor material arranged within the tapered recess.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1A-6B depict a method for fabricating a semiconductor device according to embodiments of the invention, in which:

FIG. 1A depicts a cross-sectional side view of a semiconductor device after forming a fin according to embodiments of the invention;

FIG. 6B depicts a cross-sectional side view after depositing a metal according to one or more embodiments;

FIGS. 7-12B depict a method of fabricating a semiconductor device according to embodiments of the invention, in which:

FIG. 7 depicts a cross-sectional side view of a semiconductor device after forming a fin according to embodiments of the invention;

FIG. 8 depicts a cross-sectional side view after depositing a spacer material on the fin;

FIG. 9 depicts a cross-sectional side view after partially recessing the spacer material;

FIG. 10 depicts a cross-sectional side view after recessing the fin;

FIG. 12B depicts a cross-sectional side view after depositing a metal according to one or more embodiments.

Figure 1B:
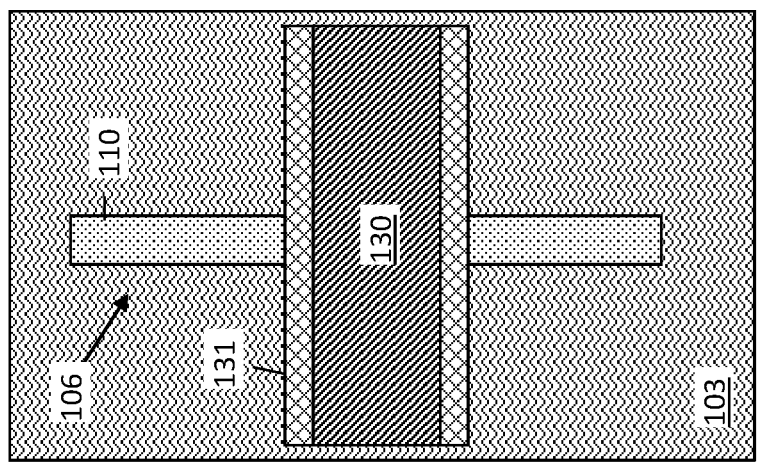
FIG. 1B depicts a top view of the semiconductor device shown in FIG. 1A.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, one particularly advantageous type of MOSFET is known generally as a fin-type field effect transistor (FinFET). The basic electrical layout and mode of operation of FinFET do not differ significantly from a traditional field effect transistor. In contrast to a planar MOSFET, however, source, drain, and channel are built as a three-dimensional bar on top of local shallow trench isolation (STI) region and semiconductor substrate. The three-dimensional bar is the aforementioned "fin," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The source and drain regions can be suitably doped to produce the desired FET polarity, as is known in the art. The dimensions of the fin establish the effective channel length for the transistor.

Another particularly advantageous type of MOSFET is known generally as a gate-all-around (GAA) nanosheet FET, which provides a relatively small FET footprint by forming the channel region as a series of nanosheets. In a GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets, which are formed in a stack and then patterned in the shape of a fin. The sacrificial nanosheets are released from the channel nanosheets before the FET device is finalized. For n-type FETs, the channel nanosheets are silicon (Si), and the sacrificial nanosheets are silicon germanium (SiGe). For p-type FETs, the channel nanosheets are either Si with sacrificial SiGe, or the channel nanosheets are SiGe with sacrificial Si.

Epitaxially grown material is used to form source/drain regions of FinFETs and nanosheet FETs. Forming epitaxially grown material to a substantially uniform height in these regions can be challenging. Epitaxially grown materials can have heights that are highly variable, even when the same process is used in the same region of a device, which can increase the fringe capacitance of the device.

Turning now to an overview of the aspects of the invention, one or more embodiments of the invention address the above-described shortcomings of the prior art by providing a method that confines the epitaxial growth within sidewall spacers so that the epitaxial growth does not grow laterally and is self-limited vertically. After forming lateral sidewall spacers on the fins (of both FinFET devices and nanosheet devices), the fins are recessed within the fin in a deep "v-shape," and the epitaxial growth is applied to confine the growth to the area of the original fin.

The above-described aspects of the invention address the shortcomings of the prior art by confining the epitaxial growth of source/drain regions within lateral spacers to mitigate non-uniform lateral and vertical growth on the fins. The v-shaped epitaxial growth extends vertically and in a substantially uniform manner. The resulting epitaxial growth reduces the fringe capacitance, and the v-shaped epitaxial growth can increase the contact area, thereby reducing contact resistance.

Figure 1A:
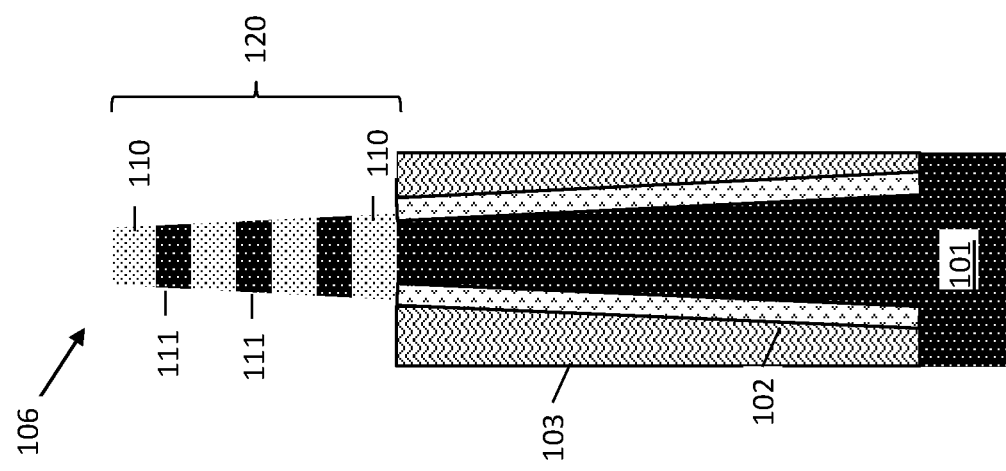

Turning now to a more detailed description of aspects of the present invention, FIGS. 1A-6B depict a method for fabricating a semiconductor device according to embodiments of the invention. FIG. 1A depicts a cross-sectional side view of a semiconductor device after forming a fin 106 according to embodiments of the invention. FIG. 1B depicts a top view of the semiconductor device shown in FIG. 1A.

The semiconductor device is a nanosheet FET and includes isolation regions 103 arranged on a semiconductor substrate 101 and around the fin 106. The isolation regions 103 are for isolation of active areas from one another.

Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The isolation regions 103 can be formed by any known method in the art, including, for example, lithography or etching to form trenches, and then filling the trenches with an insulating material, such as silicon dioxide. In the exemplary embodiment, the isolation regions 103 are shallow trench isolation regions (STIs). However, the isolation region 103 can be a trench isolation region, a field oxide isolation region (not shown), or any other equivalent known in the art. The isolation regions 103 can provide isolation between neighboring active regions and can be used when the neighboring active regions have opposite conductivities, i.e., nFETs and pFETs. As such, the at least one isolation region 103 can separate an nFET device region from a pFET device region. The isolation region 103 can also provide isolation between the source and the drain of a FinFET or nanosheet device when it is located between two fins or nanosheets in the same device type. nFET or pFET devices with multiple fins or nanosheets per active area have the isolation region 103 located between fins or nanosheets.

A fin 106 is patterned in the substrate 101. Spacers 102 can be formed around the fins 106 within the isolation regions 102. Non-limiting examples of suitable materials for the spacers 102 include dielectric oxides (e.g., silicon oxide), dielectric nitrides (e.g., silicon nitride), dielectric oxynitrides, or any combination thereof. The spacer material is deposited by a deposition process, for example, chemical vapor deposition (CVD) or physical vapor deposition (PVD). The spacer material can be etched by a dry etch process, for example, a RIE process.

The fin 106 includes a nanosheet stack 120. Although a single fin 106 and nanosheet stack 120 is shown an exemplary embodiment, the semiconductor device can include any number of fins 106 and nanosheet stacks 120, such as a plurality of fins and nanosheet stacks in other embodiments. The fin 106 and nanosheet stack 120 can be formed in the substrate 101 by patterning a mask and then etching the substrate 101. The fin 106 and nanosheet stacks 120 also can be patterned in the substrate by, for example, sidewall imaging transfer or direct print extreme ultraviolet lithography.

The nanosheet stack 120 extends over the isolation regions 103 and includes alternating layers of a first nanosheet 110 and a second nanosheet 111. The first nanosheet 110 is a semiconductor material, for example, silicon germanium in some embodiments. Other non-limiting examples of semiconductor materials for the first nanosheet 110 include Si (silicon), strained Si, SiC (silicon carbide), Ge (germanium), SiGeC (silicon-germanium-carbon), Si alloys, Ge alloys, GaAs (gallium arsenide), InAs (indium arsenide), InP (indium phosphide), or any combination thereof.

The second nanosheet 111 alternates with the first nanosheet 110 in the nanosheet stack 120. The second nanosheet 111 is a semiconductor material, for example, silicon. Other non-limiting examples of semiconductor materials for the second nanosheet 111 include strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof.

Although nanosheet stack 120 includes four layers each of first nanosheet 110 and second nanosheet 111, the nanosheet stack 120 can include any number of first nanosheets 110 and second nanosheets 111. The nanosheet stack 120 can include one or more layers of each of first nanosheet 110 and second nanosheet 111. For example, nanosheet stack 120 can include one layer of first nanosheet 110 and one layer of second nanosheet 111 disposed on the first nanosheet 110.

First and second nanosheets 110 and 111 can be formed on the substrate 101 by for example, forming alternating layers of first and second nanosheets 110 and 111 on the substrate 101, patterning the multi-layer stack into fin shaped structures, with the width of the fin 106 structures defining the width of the nanosheets. The height of the nanosheet stack 120 generally vary, as it depends on the type of device, and is not intended to be limited.

A gate 130 is arranged on the nanosheet stack 120, as shown in FIG. 1B. The gate 110 is a "dummy gate" according to one or more embodiments and includes a sacrificial gate material (dummy gate material). The sacrificial gate material can be, for example, amorphous silicon, polysilicon, amorphous carbon, a dielectric silicon dioxide, or a silicon nitride material.

The gate is an active metal gate according to one or more embodiments. The metal gate includes metal gates formed, for example, by filling a dummy gate opening (after removing the sacrificial gate material) with one or more dielectric materials, one or more workfunction metals, and one or more metal gate conductor materials. The gate dielectric material(s) can be a dielectric material having a dielectric constant greater than about 3.9, about 7.0, or about 10.0.

Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The work function metal(s) can be disposed over the gate dielectric material. The type of work function metal(s) depends on the type of transistor and can differ between an nFET and a pFET. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

A conductive metal is deposited over the dielectric material(s) and workfunction layer(s) to form the metal gate. Non-limiting examples of suitable conductive metals include aluminum (Al), platinum (Pt), gold (Au), tungsten (W), titanium (Ti), or any combination thereof. The conductive metal can be deposited by a suitable deposition process, for example, CVD, PECVD, PVD, plating, thermal or e-beam evaporation, and sputtering.

The gate 130 includes gate spacers 131. The gate spacers 131 include a dielectric material, for example, silicon dioxide, silicon nitride, SiOCN, or SiBCN. Other non-limiting examples of materials for the gates spacers 131 include dielectric oxides, dielectric nitrides, dielectric oxynitrides, or any combination thereof.

Figure 2B:
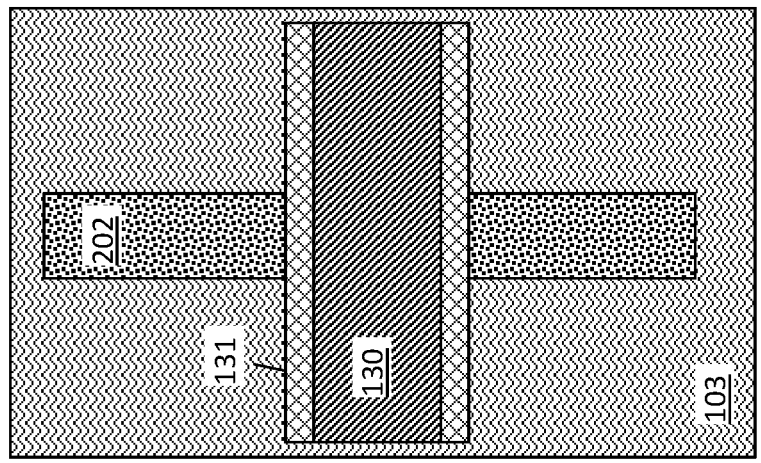
FIG. 2B depicts a top view of the semiconductor device shown in FIG. 2A.
Figure 2A:
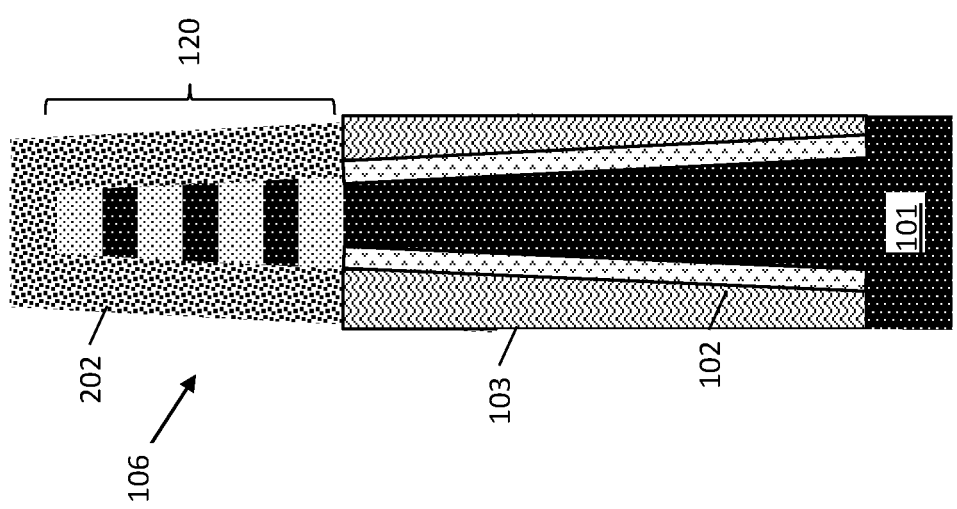
FIG. 2A depicts a cross-sectional side view after depositing a spacer material on the fin.

FIG. 2A depicts a cross-sectional side view after depositing a spacer material 202 on the nanosheet stack 120 of the fin 106. FIG. 2B depicts a top view of the semiconductor device shown in FIG. 2A.

The spacer material 202 covers and surrounds exposed areas of the nanosheet stack 120 that extends from the fin 106. The spacer material 202 is a dielectric material. According to one or more embodiments, the spacer material 202 is a low-k dielectric material. The low-k spacer material can include Si, N, and at least one element selected from the group consisting of C and B. Additionally, the low-k spacer material can contain Si, N, B, and C, and O. For example, the low-k spacer material can include SiBN, SiCN, SiBCN, SiOCN, SiON, or any combination thereof.

Figure 3B:
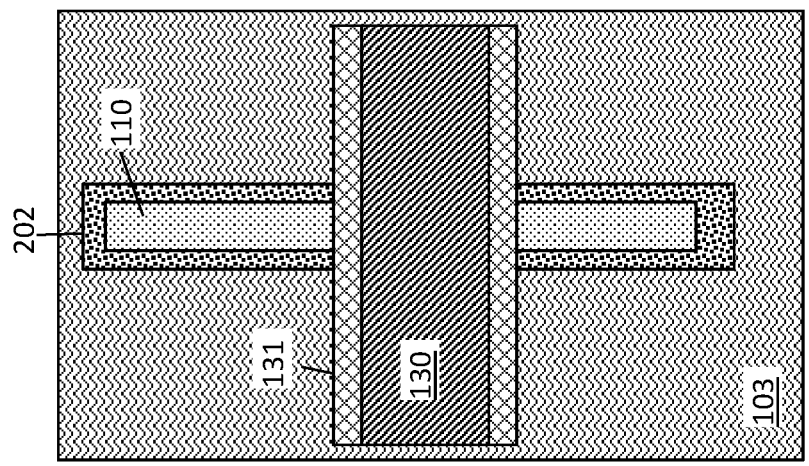
FIG. 3B depicts a top view of the semiconductor device shown in FIG. 3B.
Figure 3A:
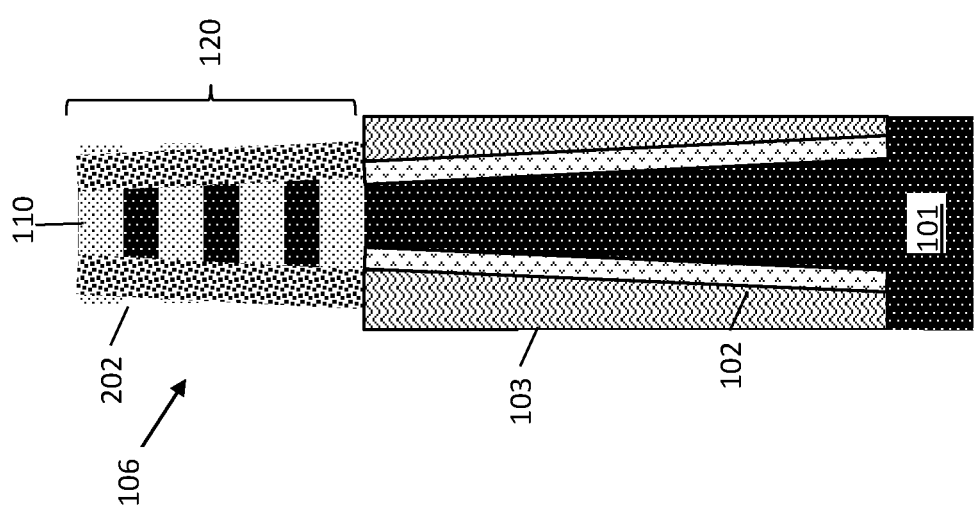
FIG. 3A depicts a cross-sectional side view after partially recessing the spacer material.

FIG. 3A depicts a cross-sectional side view after partially recessing the spacer material 202. FIG. 3B depicts a top view of the semiconductor device shown in FIG. 3B.

The spacer material 202 is partially recessed such that a top surface of the nanosheet stack 120 of the fin 106 is exposed. According to one or more embodiments, the etch process is a dry etch process and/or a wet etch process.

According to some embodiments, the etch process used to partially recess the spacer material 202 is a reactive ion etch (RIE) process.

Figure 4B:
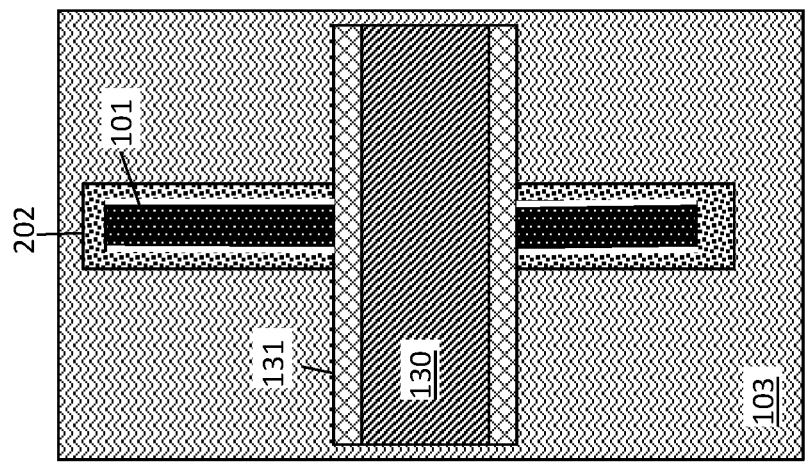
FIG. 4B depicts a top view of the semiconductor device shown in FIG. 4A.
Figure 4A:
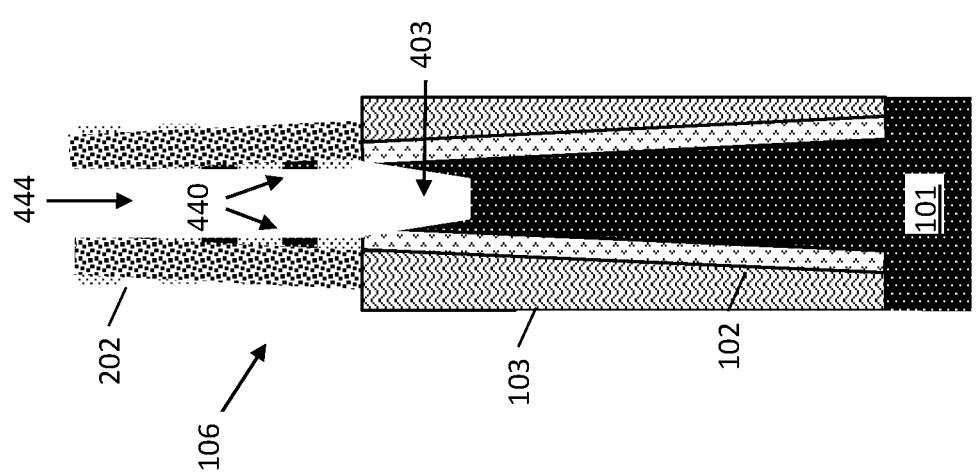
FIG. 4A depicts a cross-sectional side view after recessing the fin.

FIG. 4A depicts a cross-sectional side view after further recessing the fin 106. FIG. 4B depicts a top view of the semiconductor device shown in FIG. 4A.

Once exposed, the fin 106 is further etched to remove a portion of the fin 106 below the level of the isolation regions 103. A portion of the nanosheet stack 120 and a portion of the fin 106 in the substrate 101 are removed. A directional etch is performed to form a v-shaped or u-shaped recess 403 in the fin 106. The recess 403 has sidewalls that are angled at an oblique angle with respect to an axis perpendicular to the substrate 101. The directional etch forms a tapered cavity 444 (recess or opening) between the lateral sidewalls of the spacer material 202, which removes a majority of the nanosheet stack 120 material but leaves portions 440 of the nanosheet stack 120 on lateral sidewalls of the spacer material 202. The inner sidewalls of the tapered cavity 444 are not parallel to one another and can be arranged at any angle with respect to the normal axis to the horizontal substrate 101.

According to one or more embodiments, the directional etch is a RIE process. The RIE process can employ polymerization during the RIE. The RIE process also can be a crystal orientation dependent RIE. The resulting profile of the tapered cavity 444 is related to the fin or nanosheet profile. The fin or nanosheet profile is tapered naturally due to the non-ideality of the ME process used to pattern fins or nanosheets. The fin or nanosheet profile taper can be adjusted with the RIE depth or RIE process conditions (pressure, bias, etc.). The combination of the tapered fin or nanosheet profile and directional cavity ME leaves slivers of semiconductor material on the sidewalls of the spacer material.

Figure 5B:
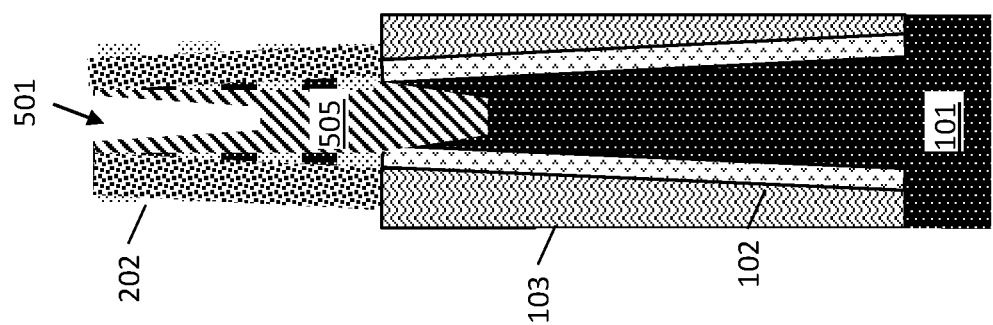
FIG. 5B depicts a cross-sectional side view after performing an epitaxial growth process according to one or more embodiments.
Figure 5A:
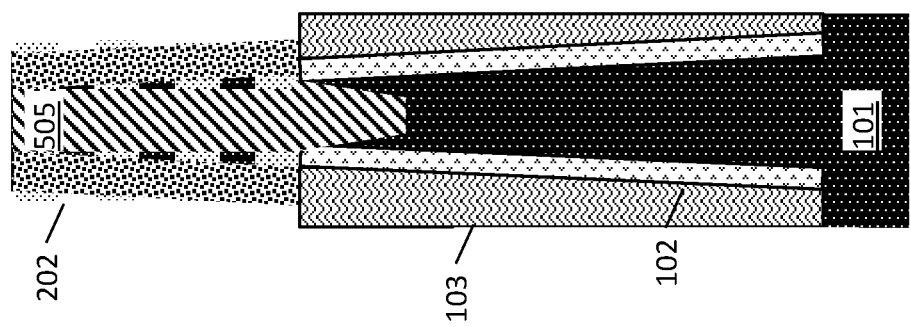
FIG. 5A depicts a cross-sectional side view after performing an epitaxial growth process according to one or more embodiments.

Following the directional etch shown in FIGS. 4A and 4B, an epitaxial growth process can be performed, as shown in FIG. 5A or 5B. FIG. 5A depicts a cross-sectional side view after performing an epitaxial growth process according to one or more embodiments. FIG. 5B depicts a cross-sectional side view after performing an epitaxial growth process according to one or more embodiments.

An epitaxial growth process is performed to deposit a crystalline semiconductor material 505 onto a crystalline substrate beneath. The deposited semiconductor material will grow from the semiconductor material of the substrate 101 at the recess 403 (see FIG. 4A). Leaving a portion 440 of the nanosheet stack 120 on the sidewalls of the spacer material 202 also allows the deposited semiconductor material to grow from the lateral sidewalls within the spacer material 202.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

According to exemplary embodiments, an epitaxial semiconductor material deposited on a {100} crystal surface will take on a {100} orientation. According to other exemplary embodiments, an epitaxial semiconductor material deposited on a {111} crystal surface will take on a {111} orientation. In some embodiments, epitaxial growth and/or deposition processes are selective to forming on semiconductor surface, and do not deposit material on dielectric surfaces, such the spacer material 202.

The processing parameters used to form the semiconductor material 505, such as temperature, pressure, acid concentration, among others, can be varied such that the semiconductor material 505 substantially fills the open recessed area within the spacer material 202, as shown in FIG. 5A, or such that the semiconductor material 505 forms a tapered opening 601 (or void) as shown in FIG. 5B. When the semiconductor material 505 is overgrown using epitaxial growth processes (FIG. 5A), the semiconductor material 505 substantially fills the area within the spacer material 202. The tapered opening 501 is formed when the semiconductor material 505 is not overgrown, as it can pinch off to form the v-shaped opening 501.

Epitaxial layers can be grown from gaseous or liquid precursors. Epitaxial growth can be deposited using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) can be doped during deposition by adding a dopant or impurity to form a silicide. The silicon can be doped with an n-type dopant (e.g., phosphorus, arsenic, or antimony) or a p-type dopant (e.g., boron), depending on the type of transistor.

Figure 6A:
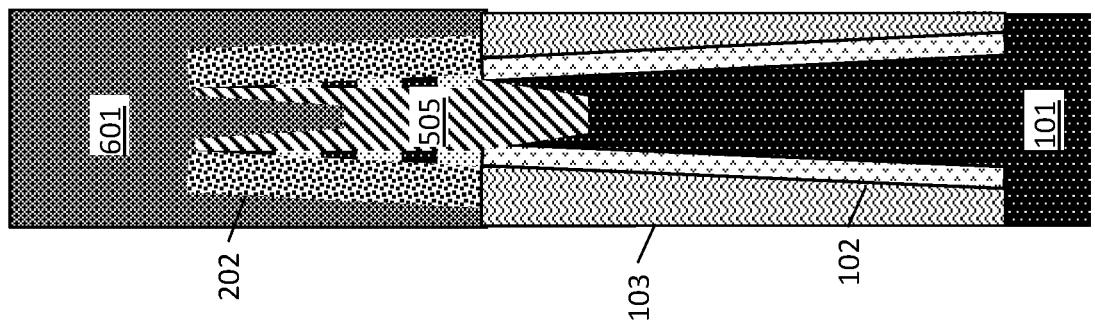
FIG. 6A depicts a cross-sectional side view after depositing a metal according to one or more embodiments.
Figure 6B:
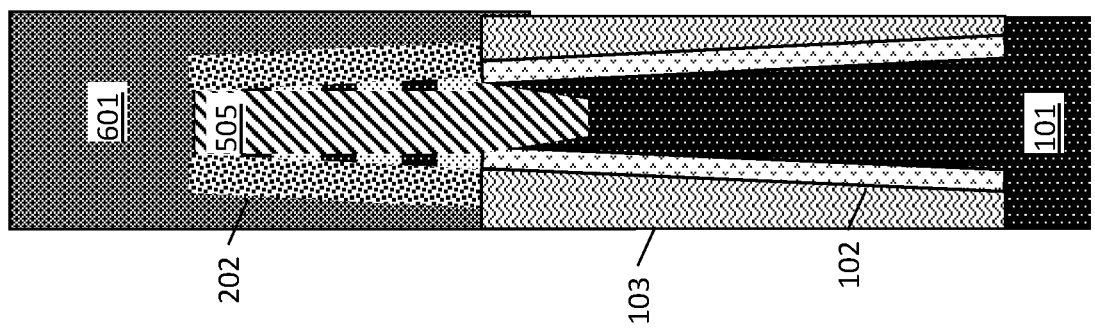

FIG. 6A depicts a cross-sectional side view after depositing a metal 601 on the semiconductor material 505 shown in FIG. 5A. FIG. 6B depicts a cross-sectional side view after depositing a metal 601 on the semiconductor material 505 shown in FIG. 5B.

The metal 601 surrounds the spacer material 202 and covers the semiconductor material 505 to form a source/drain contact. When a tapered opening is formed in the semiconductor material 505 (FIG. 6B), the metal 601 fills the opening which increases the contact area to reduce contact resistance. Optionally (not shown), the spacer material 202 can be selectively removed before metal 601 deposition to increase the contact area with the sidewalls and reduce contact resistance.

The metal 601 optionally includes a metal silicide film arranged directly on the semiconductor material 505, followed by a conductive metal fill. The metal silicide film can be formed by performing a thermal treatment to a metallic film. The metallic film can be deposited by performing an evaporation process or a sputtering process. The metallic film is then annealed by heating inside a furnace or performing a rapid thermal treatment in an atmosphere that includes pure inert gases (e.g., nitrogen or argon). Non-limiting examples of suitable metal silicide materials include titanium silicide, tungsten silicide, cobalt silicide, nickel silicide, molybdenum silicide, platinum silicide, or any combination thereof.

The conductive metal can be, but is not limited to, aluminum (Al), cobalt (Co), platinum (Pt), gold (Au), tungsten (W), titanium (Ti), or any combination thereof. The conductive material can be deposited by a suitable deposition process, for example, CVD, PECVD, PVD, plating, thermal or e-beam evaporation, or sputtering.

FIGS. 7-12B depict a method of fabricating a semiconductor device according to embodiments of the invention.

Figure 7:
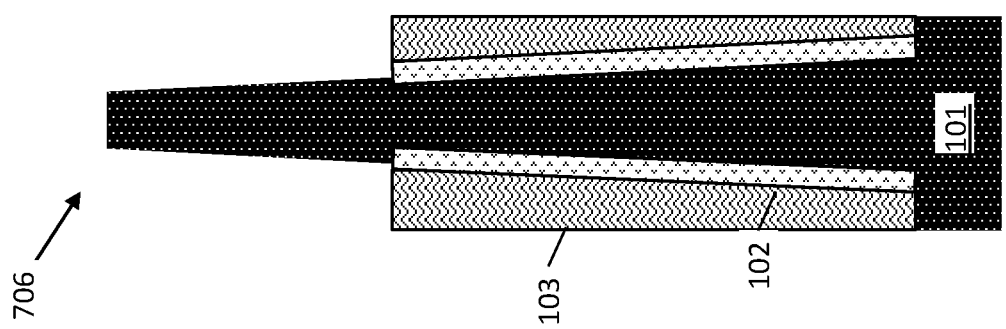

FIG. 7 depicts a cross-sectional side view of a semiconductor device after forming a fin according to embodiments of the invention.

The semiconductor device is a FinFET and includes isolation regions 103 arranged on a semiconductor substrate 101. The isolation regions 103 are for isolation of active areas from one another.

A fin 706 is patterned in the substrate 101. Spacers 102 can be formed around the fins 106 within the isolation regions 103. Although a single fin 706 is shown an exemplary embodiment, the semiconductor device can include any number of fins 706, such as a plurality of fins in other embodiments. The fin 706 can be formed in the substrate 101 by patterning a mask and then etching the substrate 101. The fin 106 also can be patterned in the substrate 101 by, for example, sidewall imaging transfer.

A gate 130 is arranged on the fin 706, as shown in FIG. 1B. The gate 110 is a "dummy gate" according to one or more embodiments and includes a sacrificial gate material (dummy gate material). The gate is an active metal gate according to one or more embodiments.

Figure 8:
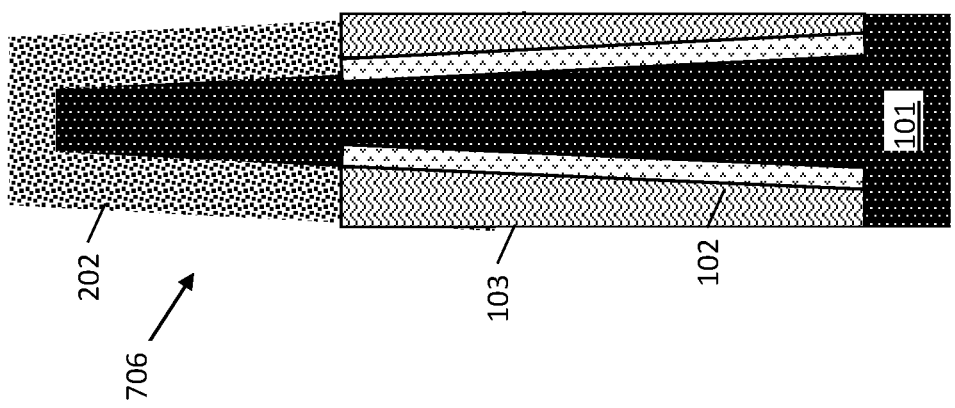

FIG. 8 depicts a cross-sectional side view after depositing a spacer material 202 on the fin 706. The spacer material 202 covers and surrounds the exposed areas of the fin 706. The spacer material 202 is a dielectric material. According to one or more embodiments, the spacer material 202 is a low-k dielectric material.

Figure 9:
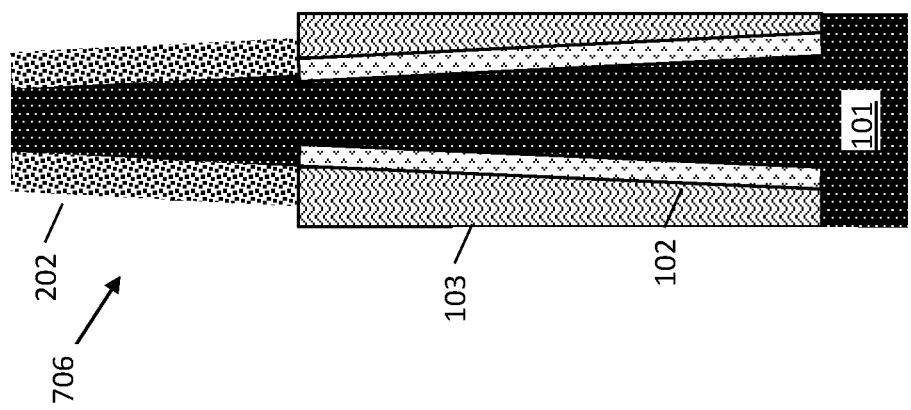

FIG. 9 depicts a cross-sectional side view after partially recessing the spacer material 202. The spacer material 202 is partially recessed such that a top surface of the fin 706 is exposed. According to one or more embodiments, the etch process is a dry etch process and/or a wet etch process. According to some embodiments, the etch process used to partially recess the spacer material 202 is a reactive ion etch (RIE) process.

Figure 10:
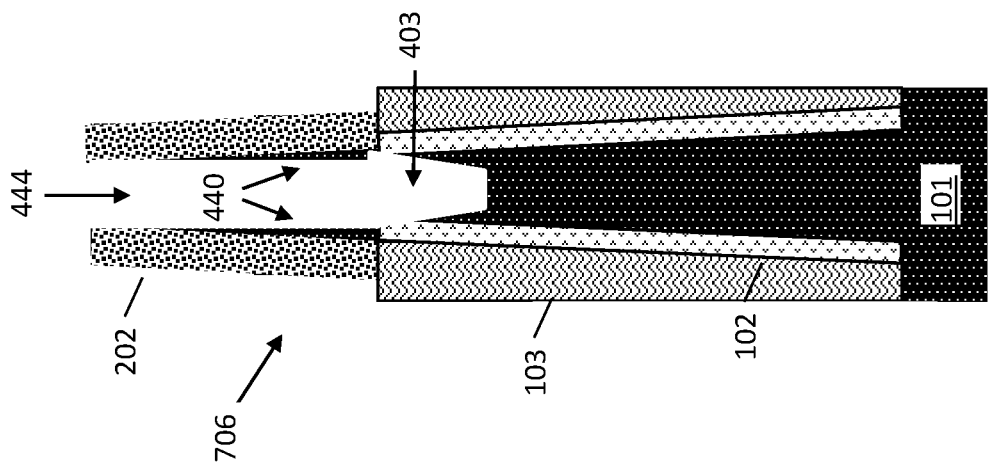

FIG. 10 depicts a cross-sectional side view after further recessing the fin 706. Once exposed, the fin 706 is further etched to remove a portion of the fin 706 from between the lateral sidewalls of the spacer material 202 and further below the spacer material 202. A directional etch is performed to form a v-shaped or u-shaped recess 403 in the fin 706. The recess 403 has sidewalls that are angled at oblique angles with respect to an axis perpendicular to the substrate 101. The directional etch forms a tapered cavity 444 between the walls of the spacer material 202, which removes a majority of the fin 706 material but leaves portions 440 of the fin 706 on lateral sidewalls of the spacer material 202. The inner sidewalls of the tapered cavity 444 are not parallel to one another and can be arranged at any angle with respect to the normal axis to the horizontal substrate 101.

Figure 11B:
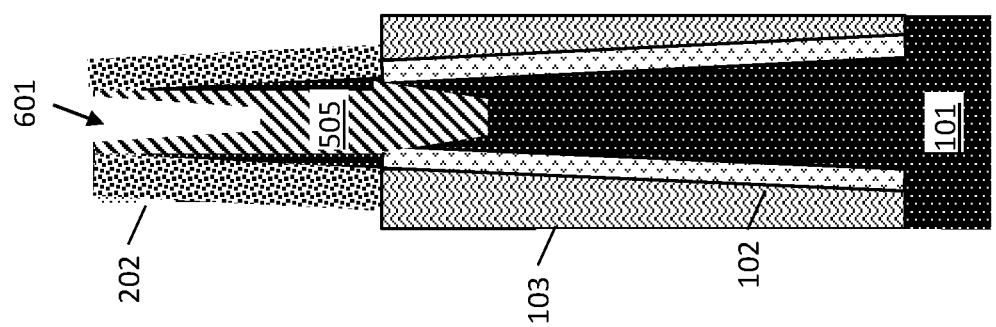
FIG. 11B depicts a cross-sectional side view after performing an epitaxial growth process according to one or more embodiments.
Figure 11A:
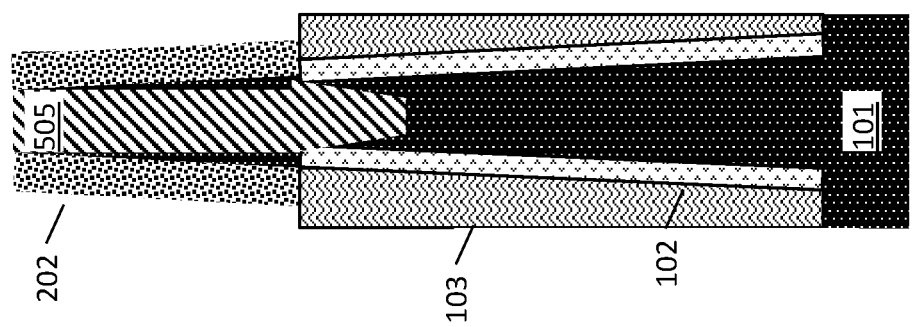
FIG. 11A depicts a cross-sectional side view after performing an epitaxial growth process according to one or more embodiments.

Following the directional etch shown in FIG. 10, an epitaxial growth process can be performed, as shown in FIGS. 11A and 11B. FIG. 11A depicts a cross-sectional side view after performing an epitaxial growth process according to one or more embodiments. FIG. 11B depicts a cross-sectional side view after performing an epitaxial growth process according to one or more embodiments.

An epitaxial growth process is performed to deposit a crystalline semiconductor material 505 onto a crystalline substrate beneath. The deposited semiconductor material will grow from the semiconductor material of the substrate 101 at the recess 403 (see FIG. 10). Leaving a portion 440 of the fin 706 on the sidewalls of the spacer material 202 also allows the deposited semiconductor material to grow from the lateral sidewalls within the spacer material 202.

The processing parameters used to form the semiconductor material 505, such as temperature, pressure, acid concentration, among others, can be varied such that the semiconductor material 505 substantially fills the open recessed area within the spacer material 202, as shown in FIG. 11A, or such that the semiconductor material 505 forms a tapered opening 601 (or void) as shown in FIG. 11B. When the semiconductor material 505 is overgrown using epitaxial growth processes (FIG. 11A), the semiconductor material 505 substantially fills the area within the spacer material 202. The tapered opening 501 is formed when the semiconductor material 505 is not overgrown, as it can pinch off to form the v-shaped opening 501.

Figure 12B:
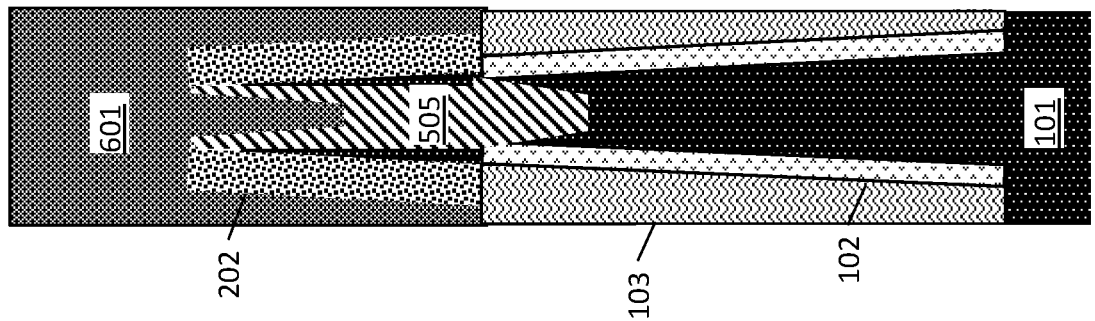
Figure 12A:
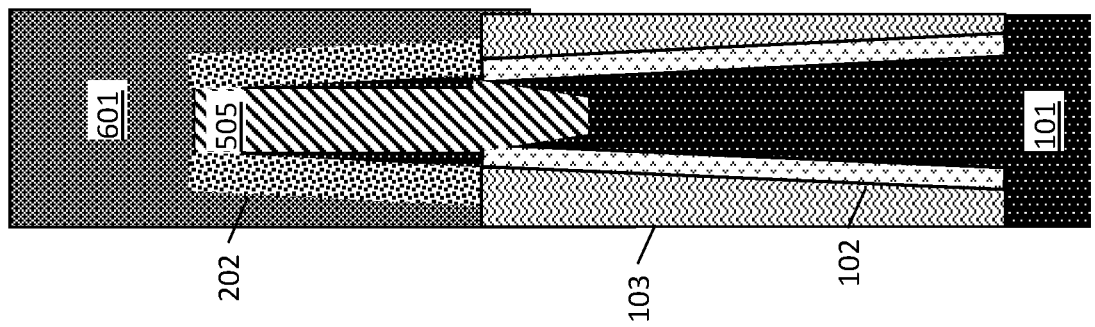
FIG. 12A depicts a cross-sectional side view after depositing a metal according to one or more embodiments.

FIG. 12A depicts a cross-sectional side view after depositing a metal 601 on the semiconductor material 505 shown in FIG. 11A. FIG. 12B depicts a cross-sectional side view after depositing a metal 601 on the semiconductor material 505 shown in FIG. 11B.

The metal 601 surrounds the spacer material 202 and covers the semiconductor material 505 to form a source/drain contact. When a tapered opening is formed in the semiconductor material 505 (FIG. 11B), the metal 601 fills the opening which increases the contact area to reduce contact resistance. Optionally (not shown), the spacer material 202 can be selectively removed before metal 601 deposition to increase the contact area with the sidewalls and reduce contact resistance.

The metal 601 optionally includes a metal silicide film arranged directly on the semiconductor material 505, followed by a conductive metal fill.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one"

and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:
1. A method of fabricating a semiconductor device, the method comprising:
  forming a fin in a substrate, the fin comprising a spacer arranged on a sidewall of the fin adjacent to an isolation region, and a nanosheet stack arranged on the fin and over the isolation region;
  depositing a spacer material on the nanosheet stack;
  recessing the spacer material so that a surface of the nanosheet stack is exposed;

removing a portion of the nanosheet stack within lateral sidewalls of the spacer material to form a recess, leaving a portion of the nanosheet stack on the lateral sidewalls; and depositing a semiconductor material within the recess.

2. The method of claim 1 further comprising depositing a metal on the semiconductor material to form a source/drain contact.

3. The method of claim 1, wherein depositing the semiconductor material comprises applying an epitaxial growth process.

4. The method of claim 3, wherein the recess comprises a tapered opening.

5. The method of claim 1, wherein recessing the spacer material comprises a reactive ion etch.

6. The method of claim 1, wherein the spacer material comprises a dielectric material.

7. The method of claim 1, wherein the spacer material comprises a low-k material.

8. The method of claim 1, wherein the spacer material comprises SiBN, SiCN, SiBCN, or any combination thereof.

9. The method of claim 1, wherein removing a portion of the nanosheet stack comprises a directional etch.

10. The method of claim 9, wherein the directional etch comprises a reactive ion etch.

11. A method of fabricating a semiconductor device, the method comprising:

forming a fin in a substrate, the fin comprising a spacer arranged on a sidewall of the fin adjacent to an isolation region, and a nanosheet stack arranged on the fin and over the isolation region;

depositing a spacer material on the nanosheet stack;

recessing the spacer material so that a surface of the nanosheet stack is exposed;

removing a portion of the nanosheet stack within lateral sidewalls of the spacer material to form a recess, leaving a portion of the nanosheet stack on the lateral sidewalls; and depositing a semiconductor material within the recess such that the semiconductor material is confined within an area of the nanosheet stack.

12. The method of claim 11 further comprising depositing a metal on the semiconductor material to form a source/drain contact.

13. The method of claim 11, wherein depositing the semiconductor material comprises applying an epitaxial growth process.

14. The method of claim 13, wherein the recess comprises a tapered opening.

15. The method of claim 11, wherein recessing the spacer material comprises a reactive ion etch.

16. The method of claim 11, wherein the spacer material comprises a dielectric material.

17. The method of claim 11, wherein the spacer material comprises a low-k material.

18. The method of claim 11, wherein the spacer material comprises SiBN, SiCN, SiBCN, or any combination thereof.

19. The method of claim 11, wherein removing a portion of the nanosheet stack comprises a directional etch.

20. The method of claim 19, wherein the directional etch comprises a reactive ion etch.

* * * * *